United States Patent

Ozguc

Patent Number: 5,689,259
Date of Patent: Nov. 18, 1997

[54] DIFFERENTAL D/A CONVERTER WITH N-BITS PLUS SIGN

[75] Inventor: Ismail H. Ozguc, Sunnyvale, Calif.

[73] Assignee: Exar Corporation, Fremont, Calif.

[21] Appl. No.: 505,812

[22] Filed: Jul. 21, 1995

[51] Int. Cl.[6] .................................................. H03M 1/66
[52] U.S. Cl. .................................... 341/144; 341/145
[58] Field of Search .............................. 341/118, 143, 341/144, 145, 141, 127

[56] References Cited

U.S. PATENT DOCUMENTS

| | | | |
|---|---|---|---|
| 3,582,941 | 6/1971 | Le Maout et al. | 341/138 |
| 4,430,642 | 2/1984 | Weigand et al. | 341/141 |
| 4,473,818 | 9/1984 | Youngquist | 341/127 |
| 4,488,144 | 12/1984 | Wollman | 341/118 |
| 5,257,027 | 10/1993 | Murota | 341/153 |
| 5,376,936 | 12/1994 | Kerth et al. | 341/150 |
| 5,389,928 | 2/1995 | Coppero et al. | 341/150 |
| 5,394,146 | 2/1995 | Arimoto et al. | 341/118 |

*Primary Examiner*—Marc S. Hoff
*Attorney, Agent, or Firm*—Townsend and Townsend and Crew LLP

[57] ABSTRACT

The present invention provides a digital-to-analog converter which uses two separate digital-to-analog converters for the first N-bits. The N+1 bit, which is the sign bit in a sign and magnitude digital format, is used to provide the difference between the two digital-to-analog converters to the output for a first value, and to switch the DAC outputs for a second value of the sign bit. The present invention thus eliminates the parasitic capacitance of the N+1 bit by using a differential input which is switched depending on the sign bit.

8 Claims, 2 Drawing Sheets

DIFFERENTIAL D/A CONVERTER WITH N-BITS PLUS SIGN

BACKGROUND OF THE INVENTION

The present invention relates to digital-to-analog converters (DACs), and in particular to differential DACs.

A digital-to-analog converter converts a digital code into the corresponding analog value. This digital code could be in a number of formats, such as twos complement, ones complement, or sign and magnitude. In a typical implementation, for each bit position, a current is produced if the bit is a digital one. The amount of current produced doubles for each bit position to provide the relative magnitude, with the sum of the currents being provided to a resister to provide the corresponding voltage.

The response time of a digital-to-analog converter is affected by the amount of current for a particular value due to the parasitic capacitance generated. The amount of parasitic capacitance is proportional to the amount of current, and thus more capacitance is added by the more significant bit positions. In fact, the N+1 bit position will by itself add the same amount of parasitic capacitance as all the lower bit positions combined. Thus, each more significant bit doubles the parasitic capacitance of the entire circuit, thus limiting the response time of the output. It would be desirable to provide a digital-to-analog converter which provides an improved response time.

SUMMARY OF THE INVENTION

The present invention provides a digital-to-analog converter which uses two separate digital-to-analog converters for the first N-bits. The N+1 bit, which is the sign bit in a sign and magnitude digital format, is used to control which output line each of the two DACs are connected to. For a first value of the sign bit, the positive DAC is provided to the positive output line and the negative DAC to the negative output line. For a second value of the sign bit, the DAC outputs are switched, with the positive DAC output being connected to the negative output line and vice-versa. The present invention thus eliminates the parasitic capacitance of the N+1 bit in a DAC by instead using a balanced output which is switched depending on the N+1 (sign) bit.

The two DACs are connected to a common node, which can be grounded in a system having positive and negative voltage supplies. In a system having only ground and a positive supply, the common node is connected to an intermediate reference voltage. The first N-bit DAC generates positive values compared to the reference voltage, while the second N-bit DAC generates the complementary (negative relative to the reference voltage) values corresponding to the same digital code. Both outputs are readily available, which makes the circuit well suited for balanced or differential applications such as PCM pulse shaping for T1 line interface units used in telecommunications circuits.

The present invention eliminates the capacitive loading of the most significant bit, by instead switching the two DAC outputs using a set of switches which have minimal capacitance. Accordingly, the present invention will have a faster settling time for the final analog value than prior art DACs. Although two N-bit DACs are used in the present invention, the total number of transistors is comparable to an equivalent N+1 bit DAC of prior art. This is because the most significant bit (MSB), that is N+1st bit, of prior art DAC must have 2N transistors connected to the node common to the rest of bit positions, N, N/2, etc. This presents a large capacitive load on a single node. The present invention, on the other hand, uses a similar number of transistors, namely 2N−1 transistors, connected to a separate node to form the second DAC. Thus, the parasitic capacitance is reduced by eliminating the need for the N+1 bit or node, which would normally add a parasitic capacitance equal to all the other bits combined. Hence, by splitting the common node, the switching speed is increased. Moreover, the transistors can also be half the size, further improving the speed and reducing overall silicon area.

For a further understanding of the nature and advantages of the invention, reference should be made to the ensuing detailed description taken in conjunction with accompanying drawings.

DETAILED DESCRIPTION OF THE PREFERRED EMBODIMENT

Figures 1A, 1B, 1C:
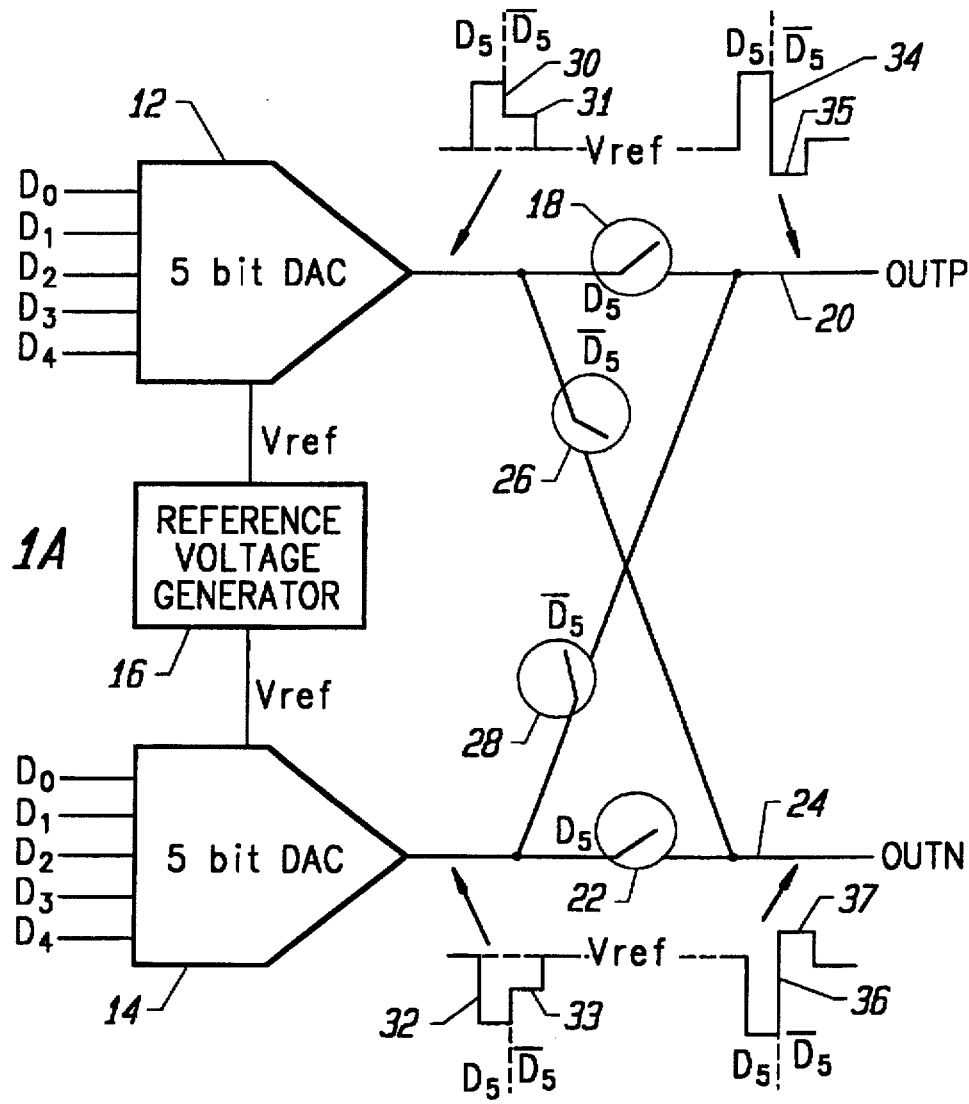
FIG. 1A is a block diagram of a DAC according to the present invention.
FIG. 1B is a graph of the amplitude of the output of positive DAC 12.
FIG. 1C is a graph of the amplitude of the output of negative DAC 14.

FIG. 1 is a block diagram of an embodiment of the present invention. Two digital-to-analog converters (DACs) 12 and 14 are shown. In the example shown, these are 5-bit DACs; however, any code length could be used. DAC 12 is configured to generate positive values above a voltage reference $V_{ref}$ while DAC 14 is configured to generate negative values below the same $V_{ref}$. A reference voltage generator 16 provides the same $V_{ref}$ to both DACs.

The DACs of FIG. 1 are actually used to convert a 6-bit code represented by D0–D5. The last bit, D5, is used to control four switches which connect the outputs of the DACs in cross-coupled fashion. When D5, the sign bit, is asserted (high), switch 18 is closed to assert the positive DAC 12 output on output line 20 as output signal OUTP. Similarly, switch 22 is closed to assert the output of DAC 14 on output line 24 as output signal OUTN. For a negative sign bit, D5 will be low, and the connections will be reversed. In this case, switches 26 and 28 will be closed to cross-couple the outputs, with switches 18 and 22 being open. In this instance, OUTP has a value lower than $V_{ref}$ and OUTN has a value higher than $V_{ref}$. Thus, this provides a negative sign for the output. Since both complementary outputs are available, the circuit is differential.

FIG. 1B illustrates the impact of the switching on the output of the positive DAC 12. When D5 is positive (1), an amplitude 30 is passed through to OUTP unchanged as amplitude 34 shows. However, when D5 is negative (0), an amplitude 31 is shown being passed as an amplitude 35, which is inverted. Similarly for negative DAC 14 as shown in FIG. 1C, an amplitude 32 is passed through to OUTN unchanged as amplitude 36 when D5 is positive, and amplitude 33 is inverted to become positive amplitude 37 when D5 is negative.

Figure 2:
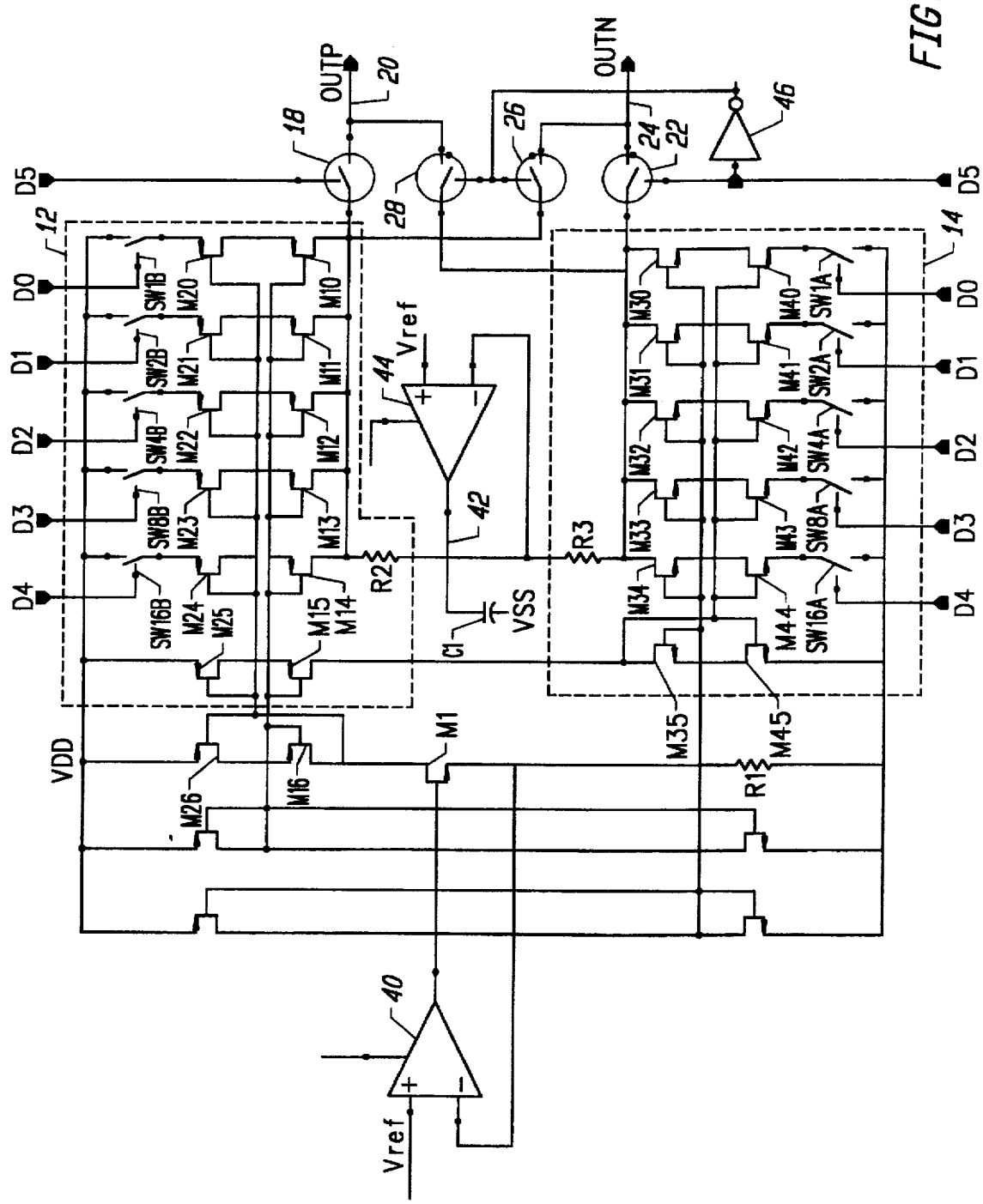
FIG. 2 is a circuit diagram of the invention of FIG. 1.

FIG. 2 is a circuit diagram of an exemplary embodiment of the circuit of FIG. 1A. As can be seen, positive DAC 12 receives the data inputs D0–D4. Similarly, negative DAC 14 is connected to the same data inputs. Each of the data inputs are connected to switches SW1A, SW2A, SW4A, SW8A, and SW16A, respectively, for data inputs D0–D4. The numerical values assigned in these switches indicate the amount of current which will be conducted when the data bit is activated, with the least significant bit being a value of 1, the next being double that, and so on. Similarly, the data inputs of DAC 12 are connected to switches SW1B through SW16B.

Referring to DAC 12, the switches SW1B–SW16B connect to transistor pairs formed of M10–M14 and M20–M24. These transistors mirror a current provided from a voltage-to-current converter composed of op-amp 40, transistor M1 and resistor R1. This current is also mirrored by transistors M16 and M26. Depending on the code present on lines D0–D4, the voltage across R2 is a linear function of the current through R1. The voltage across R2 is presented at the output OUTP if switch 18 is closed. This voltage on OUTP will be positive with respect to a center node 42. An op amp 44 buffers the $V_{ref}$ input and provides it to maintain node 42 at this level. This node is also filtered by a bypass capacitor C1 to minimize noise.

The same current that sets the positive output value present on R2 is also used for the lower DAC 14. For this purpose, M15 and M25 are used in conjunction with M35 and M45 to mirror this current to a set of binary weighted transistors M30–M34 and M40–M44. These devices are used in conjunction with switches SW1A–SW16A to form the lower DAC 14. The total current passing through R3 is a linear function of the current set by R1. The voltage across R3 makes output node OUTN more negative than center node 42 if switch 22 is closed. The magnitude of the voltage across R3 is the same as that across R2, but of an opposite sign. R2 and R3 are identical. Thus, complementary values are present at nodes OUTP and OUTN.

The last input bit, D5, is the sign bit which controls the four output switches, 18, 22, 26, and 28. When D5 is high, switches 18 and 22 are closed, while inverter 46 provides a control signal to open switches 28 and 26. This indicates that the sign is positive. If D5 is low, on the other hand, switches 28 and 26 are closed to cross-couple the outputs while switches 18 and 22 are open.

The present invention thus provides a faster switching output utilizing the sign bit. If D5 instead were connected to another switch in the DACs, a hypothetical switch SW32 and corresponding transistors, the current passed by such an arrangement would be equal to that of the current passed by all the other transistors and switches SW1A–SW16A of the DAC. This would present twice the capacitance on the output node. The elimination of this large amount of parasitic capacitance provides improved switching speed. The output switches themselves do not add significant parasitic capacitance. This is because they do not have to be large in size since they are switching a voltage level and do not need to pass a large amount of current.

While FIG. 2 shows the center node 42 being set to an intermediate $V_{ref}$ value, this configuration is useful for systems which have a single voltage and ground. For a system having positive and negative voltages and ground, node 42 could be tied to ground instead. In the embodiment of FIG. 2, $V_{ref}$ would preferably be chosen to be 2.5 volts for a 5-volt system having a ground and no negative voltage.

The present invention can operate with other digital forms than sign and magnitude by providing a converter circuit between the inputs D0–D5 to convert from twos complement, ones complement, or another format into sign and magnitude format. Also, for large loads, an output driver can be coupled to the output lines 20 and 24 carrying output signals OUTP and OUTN.

In the example shown, $V_{DD}$ can be, for instance, 5 volts and $V_{SS}$ can be ground. Amplifier 44 forces the center node 42 to the $V_{ref}$ value, preventing cross-talk between R2 and R3.

As will be understood by those with skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A differential digital to analog converter comprising:

a first digital to analog converter for converting n digital bits on n input lines to a first analog value on a first output;

a second digital to analog converter for converting said n digital bits on said n input lines to a second analog value on a second output; and switching means, having a control input coupled to an n+1 digital bit input line, for switching said first and second outputs, said first and second outputs providing a differential output.

2. The converter of claim 1 wherein said first analog value is positive and said second analog value is negative with respect to a reference node.

3. The converter of claim 1 wherein said first and second digital to analog converters are connected to a common internal node, and further comprising an operational amplifier having an output connected to said common internal node and an input coupled to a reference voltage.

4. The converter of claim 3 wherein said first digital to analog converter is connected between a positive voltage and said common internal node, and said second digital to analog converter is connected between said common internal node and ground.

5. The converter of claim 1 wherein said first and second digital to analog converters are connected to a common ground node, said first digital to analog converter being connected between a positive voltage supply and said common ground node, and said second digital to analog converter being connected between said common ground node and a negative voltage supply.

6. The converter of claim 1 wherein said switching means comprises:

a first switch connecting said first digital to analog converter output to a first circuit output;

a second switch connecting said second digital to analog converter output to a second circuit output;

a third switch connecting said first digital to analog converter output to said second circuit output; and a fourth switch connecting said second digital to analog converter output to said first circuit output.

7. The converter of claim 1 further comprising a digital converter, connected to said input lines, for converting a digital code into sign and magnitude format.

8. The converter of claim 1 further comprising:

a voltage to current converter;

a plurality of current mirrors in said first and second digital to analog converters coupled to an output of said voltage to current converter; and a plurality of switches, each coupled between one of said input lines and one of said current mirrors.

* * * * *